United States Patent
Liang

(10) Patent No.: US 11,942,397 B2
(45) Date of Patent: Mar. 26, 2024

(54) SERIES CONNECTED WATER COOLING STRUCTURE

(71) Applicant: ABLECOM TECHNOLOGY INC., Taoyuan (TW)

(72) Inventor: Chien-Fa Liang, Taoyuan (TW)

(73) Assignee: ABLECOM TECHNOLOGY INC., Taoyuan (TW)

( * ) Notice: Subject to any disclaimer, the term of this patent is extended or adjusted under 35 U.S.C. 154(b) by 0 days.

(21) Appl. No.: 17/715,409

(22) Filed: Apr. 7, 2022

(65) Prior Publication Data

US 2023/0324124 A1  Oct. 12, 2023

(51) Int. Cl.
| | |
|---|---|
| *H01L 23/473* | (2006.01) |
| *H05K 7/20* | (2006.01) |
| *F28D 1/02* | (2006.01) |
| *F28F 3/04* | (2006.01) |

(52) U.S. Cl.
CPC ....... *H01L 23/473* (2013.01); *H05K 7/20218* (2013.01); *F28D 1/0226* (2013.01); *F28F 3/048* (2013.01); *F28F 2230/00* (2013.01); *F28F 2250/08* (2013.01)

(58) Field of Classification Search
CPC .... F28F 3/048; F28F 2210/10; F28F 2250/08; F28F 2230/00; H01L 23/473; H05K 7/20254; H05K 7/20272
See application file for complete search history.

(56) References Cited

U.S. PATENT DOCUMENTS

| | | | | |
|---|---|---|---|---|
| 3,481,393 | A | * | 12/1969 | Chu ...................... H01L 23/473 165/104.31 |
| 5,144,531 | A | * | 9/1992 | Go ........................ H01L 23/473 257/E23.098 |
| 6,970,355 | B2 | * | 11/2005 | Ellsworth, Jr. .... H05K 7/20781 174/15.1 |

(Continued)

FOREIGN PATENT DOCUMENTS

| | | |
|---|---|---|
| CN | 101583262 A | 11/2009 |
| TW | M612914 U | 6/2021 |
| TW | M627038 U | 5/2022 |

OTHER PUBLICATIONS

Machine Translation of CN 101583262, retrieved Feb. 23, 2022 (Year: 2023).*

(Continued)

*Primary Examiner* — Eric S Ruppert
*Assistant Examiner* — Hans R Weiland
(74) *Attorney, Agent, or Firm* — Chun-Ming Shih; HDLS IPR SERVICES

(57) ABSTRACT

This disclosure provides a series connected water cooling structure. Each water cooling head includes a housing, and the housing includes a water inlet and a water outlet. The connecting pipes are connected between the water cooling heads to be in a series manner. The connecting pipes are connected to the water inlets of adjacent water cooling heads to configure the series connected water cooling heads. The water-inlet pipe and the water-outlet pipe are connected to the water inlet and water outlet of the series connected water cooling heads respectively. The water-inlet pump and the water-outlet pump are arranged on the water-inlet pipe and the water-outlet pipe respectively. Therefore, the heat dissipation efficiency is improved.

6 Claims, 4 Drawing Sheets

(56) References Cited

U.S. PATENT DOCUMENTS

| | | | | |
|---|---|---|---|---|
| 8,432,691 | B2* | 4/2013 | Toftloekke | H01L 23/473 |
| | | | | 361/679.55 |
| 9,210,831 | B2* | 12/2015 | Arvelo | H01L 23/473 |
| 2002/0117291 | A1* | 8/2002 | Cheon | H05K 7/20272 |
| | | | | 165/80.4 |
| 2005/0128705 | A1* | 6/2005 | Chu | H01L 23/473 |
| | | | | 361/689 |
| 2007/0070600 | A1* | 3/2007 | Tomioka | F28D 15/0266 |
| | | | | 361/688 |
| 2015/0237767 | A1* | 8/2015 | Shedd | H05K 7/20772 |
| | | | | 165/104.31 |
| 2019/0239388 | A1* | 8/2019 | Tsai | H01L 23/473 |
| 2020/0124337 | A1* | 4/2020 | Tokeshi | H01L 23/473 |

OTHER PUBLICATIONS

Office Action dated Jun. 16, 2022 of the corresponding Taiwan patent application No. 111101091.

* cited by examiner

SERIES CONNECTED WATER COOLING STRUCTURE

BACKGROUND OF THE DISCLOSURE

Technical Field

The technical field relates to a liquid cooling device, and more particularly relates to a liquid (water) cooling device with a pump structure.

Description of Related Art

A liquid cooling system includes a water cooling head, a water pump and multiple connecting pipes. The connecting pipes are filled with working fluid (water, etc.) for circulation. Thus, the water cooling head may contact the heat source to take away the heat, and the working fluid in the connecting pipes is driven by the water pump for circulation. As a result, the working fluid flows through the water cooling head and performs the heat exchange to achieve the purpose of heat dissipation.

However, the water pressure increment by the water pump pressure or lift head of a single water pump is limited, and the efficiency of the cooling system may be reduced when the water pump fails. Additionally, electronic devices of the related art often need to multiple heat dissipation modules to dissipate heat from multiple heated components inside. Furthermore, the heat dissipation modules inside the electronic devices of the related art are usually arranged independently. Each heat dissipation module is disposed with only one water pump and one water cooling head to dissipate heat from single heat source. The heat dissipation modules require more connecting pipes and that causes the cooling system occupying more space, it is necessary to design the heat dissipation structure of the liquid cooling system to meet usage needs and improve the heat dissipation efficiency of the liquid cooling system.

In view of the above drawbacks, the inventor proposes this disclosure based on his expert knowledge and elaborate researches in order to solve the problems of related art.

SUMMARY OF THE DISCLOSURE

One object of this disclosure is to provide a series connected water cooling structure, in which the uniform flow of circulation is achieved by the arrangement of multiple water pumps to improve the heat dissipation efficiency of the liquid cooling system.

In order to achieve the object mentioned above, this disclosure provides a series connected water cooling structure including a plurality of water cooling heads, a plurality of connecting pipes, a water-inlet pipe, a water-outlet pipe, a water-inlet pump, and a water-outlet pump. Each of the plurality of water cooling head includes a housing, and the housing includes a water inlet and a water outlet. The plurality of connecting pipes is connected between any two adjacent water cooling heads to be in a series manner. Each of the plurality of connecting pipes includes one end connected to the water inlet of one of the two adjacent water cooling heads and the other end connected to the water inlet of another one of the two adjacent water cooling heads to configure series connected water cooling heads. The water-inlet pipe is connected to the water inlet of one of the outermost water cooling heads of the series connected water cooling heads. The water-outlet pipe is connected to the water outlet of the other one of the outermost water cooling heads of the series connected water cooling heads. The water-inlet pump is arranged on the water-inlet pipe. The water-outlet pump is arranged on the water-outlet pipe.

Comparing with the related art, the series connected water cooling structure of this disclosure includes a plurality of water cooling heads, a water-inlet pump, and a water-outlet pump. The water cooling heads are arranged in series to simplify and reduce the overall size of the water cooling structure. Additionally, water pumps are arranged both on the water-inlet pipe and the water-outlet pipe. Two water pumps are arranged with different pressures to adjust the pressures and flows of the water-inlet pump and the water-outlet pump to achieve the effect of uniform flow and uniform temperature. Therefore, the effect of uniform flow and uniform temperature may be achieved under the minimum pressure for energy saving and enhance the practicability of use.

BRIEF DESCRIPTION OF DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
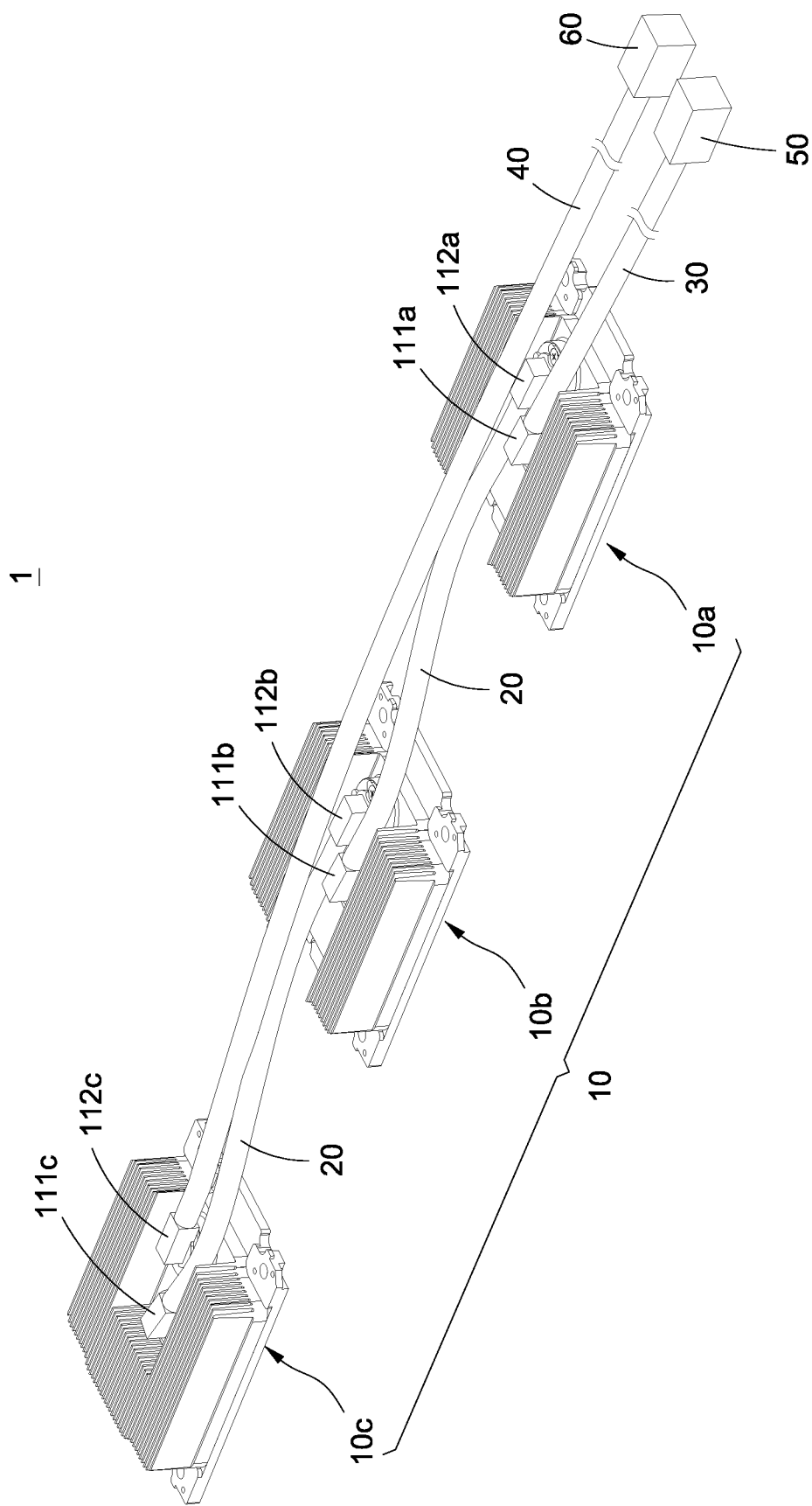
FIG. 1 is a perspective schematic view of the series connected water cooling structure in this disclosure.
Figure 2:
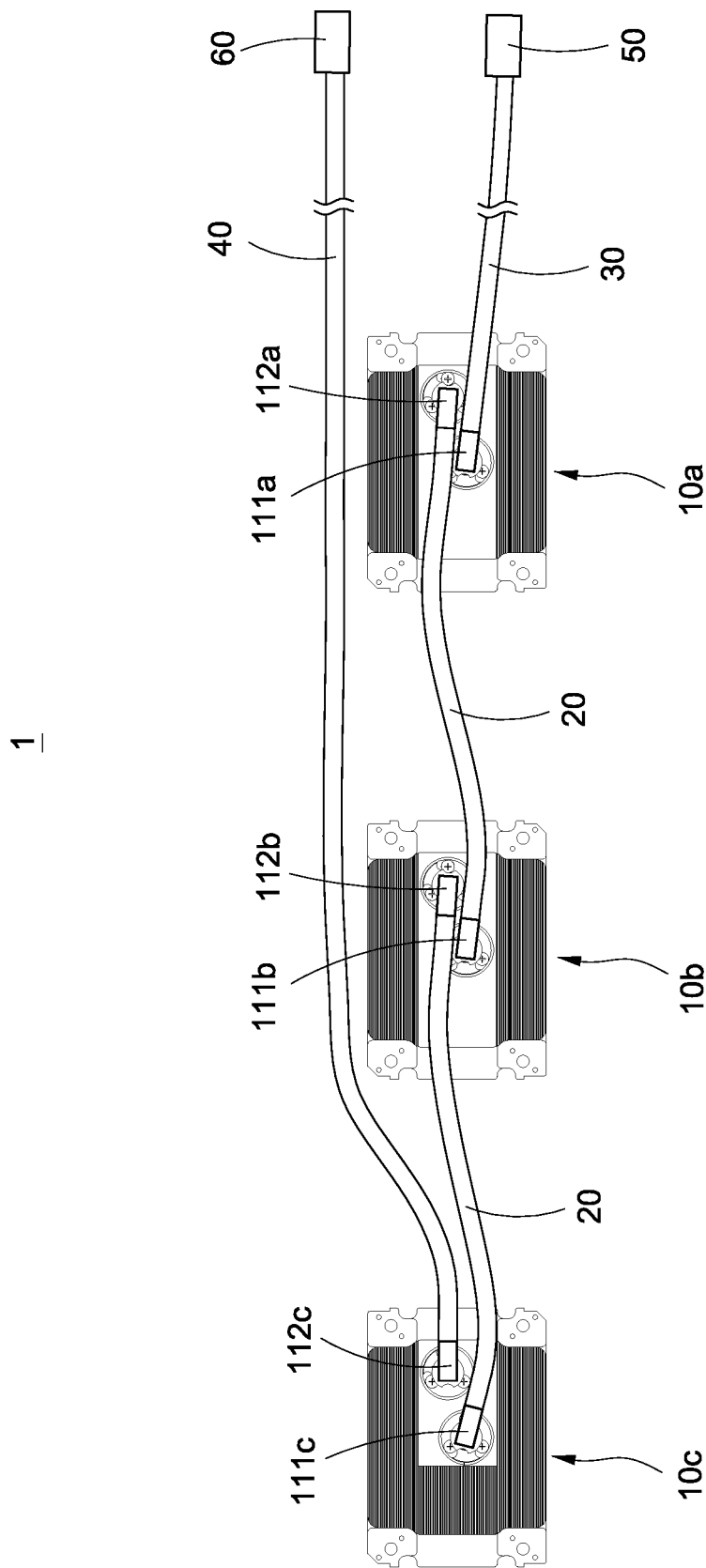
FIG. 2 is a top view of the series connected water cooling structure in this disclosure.

Please refer to FIG. 1 and FIG. 2, which respectively depict a perspective schematic view and a top view of the series connected water cooling structure in this disclosure. This disclosure is a series connected water cooling structure 1 including a plurality of water cooling heads 10, a plurality of connecting pipes 20, a water-inlet pipe 30, a water-outlet pipe 40, a water-inlet pump 50 and a water-outlet pump 60. The connecting pipes 20 are arranged between the water cooling heads 10 to configure the water cooling heads 10 to be the series connected water cooling heads 10. Additionally, the water-inlet pipe 30 and the water-outlet pipe 40, the water-inlet pump 50 and the water-outlet pump 60 are respectively disposed at two ends of the series connected water cooling heads 10. The series connected water cooling structure 1 is described in more detail as follows.

In this embodiment, the plurality of water cooling heads 10 include adjacent water cooling heads 10a, 10b, 10c, and the two outermost water cooling heads 10 are the water cooling heads 10a, 10c. Please refer to FIG. 3 and FIG. 4, which respectively depict a perspective exploded schematic view and a cross sectional view of the water cooling head in this disclosure. The structure of the water cooling head 10 in this disclosure is described in detail as follows.

Taking the water cooling head 10a as an example, the water cooling head 10a includes a housing 11a, and the housing 10a includes a water inlet 111a and a water outlet 112a. Furthermore, one side of the water cooling head 10a is used for attaching to a heat source (not shown in figures), and another side (opposite to the one side) of the water cooling head 10a includes the water inlet 111a and the water outlet 112a. Moreover, the water cooling head 10b includes the water inlet 111b and the water outlet 112b, and another water cooling head 10c includes the water inlet 111c and the water outlet 112c.

The plurality of connecting pipes 20 are connected serially between the adjacent water cooling heads 10a, 10b and the water cooling heads 10b, 10c. For example, one end of the connecting pipe is connected to the water inlet 111a of one water cooling head 10a in the adjacent water cooling heads 10a, 10b, and the other end of the connecting pipe 20 is connected to the water inlet 111b of the other water cooling head 10b. Additionally, the connecting pipe 20 is connected to the adjacent water cooling heads 10b, 10c in the same manner. Therefore, the series connected water cooling heads 10 are configured by the adjacent water cooling heads 10a, 10b and 10c.

Moreover, the water-inlet pipe 30 is connected to the water inlet 111a of the outermost water cooling head 10a among the series connected water cooling heads 10. The water-outlet pipe 40 is connected to the water outlet 112c of another outermost water cooling head 10c among the series connected water cooling heads 10. Furthermore, the water-inlet pump 50 is arranged on the water-inlet pipe 30. The water-outlet pump 60 is arranged on the water-outlet pipe 40.

Further, the water-inlet pump 50 and the water-outlet pump 60 are arranged with different pump pressures. In some embodiments, the pump pressure of the water-inlet pump 50 is a positive pressure, and the pump pressure of the water-outlet pump 60 is a negative pressure. Moreover, the pump pressure of the water-inlet pump 50 is greater than that of the water-outlet pump 60.

Accordingly, the series connected water cooling structure 1 may be set with different pump pressures through the water-inlet pump 50 and the water-outlet pump 60. The pressure and flow of the water-inlet pump 50 and the water-outlet pump 60 may be adjusted at any time. Therefore, the effect of uniform flow and uniform temperature may be achieved under the minimum pressure for energy saving.

Figure 3:
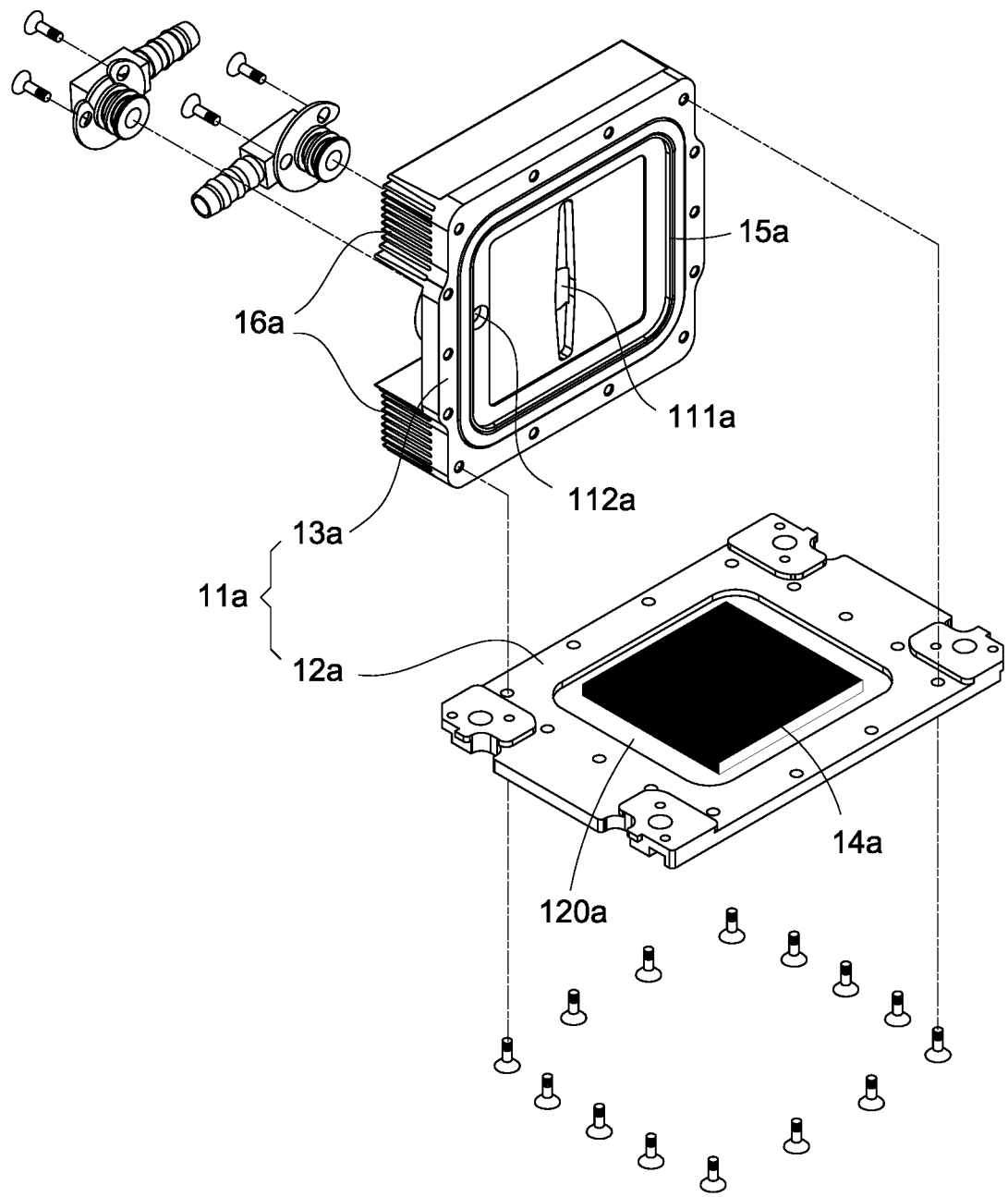
FIG. 3 is a perspective exploded schematic view of the water cooling head in this disclosure.
Figure 4:
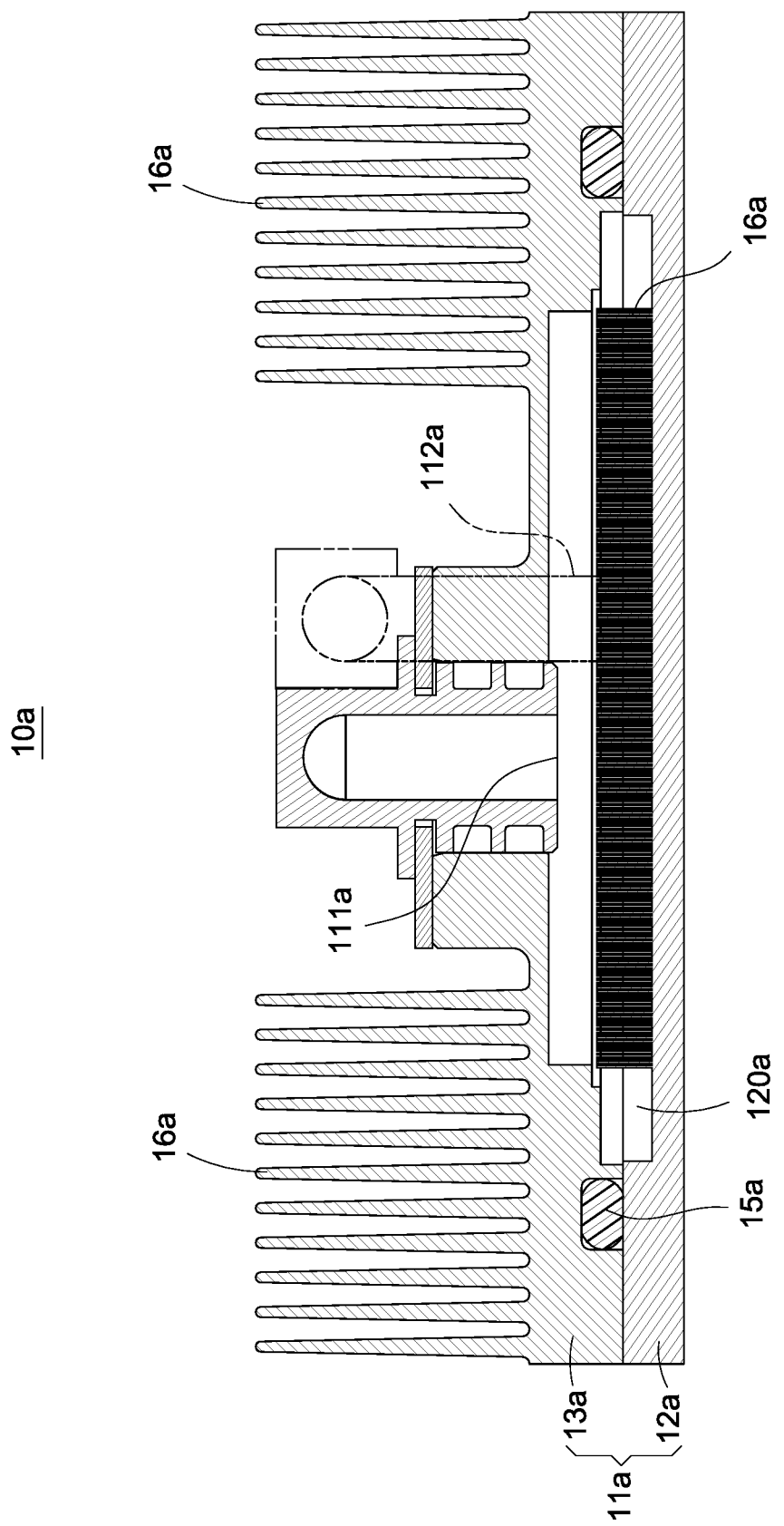
FIG. 4 is a cross sectional view of the water cooling head in this disclosure.

Please refer to FIG. 3 and FIG. 4. Taking the water cooling head 10a as an example, the water cooling head 10a includes a housing 11a, and the housing 11a includes a water inlet 111a and a water outlet 112a. Furthermore, the housing 11a includes a lower seat 12a and an upper seat 13a. The lower seat 12a includes a lower chamber 120a, and a plurality of water cooling fins 14a are disposed in the lower chamber 120a. Specifically, the upper seat 12a includes the water inlet 111a and the water outlet 112a, and the upper seat 12a is combined with the lower seat 13a to cover the lower chamber 120a.

In one embodiment of this disclosure, the water cooling head 10a further includes a sealing gasket 15a. The sealing gasket 15a is sandwiched between the lower seat 12a and the upper seat 13a to keep the airtightness therebetween. It should be noted that the water inlet 111a and the water outlet 112a are located approximately in the middle of the upper seat 13a to facilitate the working fluid inside the water cooling head 10a flowing uniformly.

Moreover, the water cooling head 10a further includes a plurality of heat dissipation fins 16a. The heat dissipation fins 16a are arranged on two sides of the upper seat 13a to increase the heat dissipation area for improving the heat dissipation efficiency. Furthermore, the water inlet 111a and the water outlet 112a are arranged parallelly (in a front-rear manner) between the heat dissipation fins 16a disposed on two sides of the upper seat 13a.

While this disclosure has been described by means of specific embodiments, numerous modifications and variations could be made thereto by those skilled in the art without departing from the scope and spirit of this disclosure set forth in the claims.

What is claimed is:

1. A water cooling structure, comprising:
a plurality of water cooling heads, each of the plurality of water cooling heads comprising a housing, and the housing comprising a water inlet and a water outlet;
a plurality of connectors, each comprising a first connecting tube connected to the water inlet or the water outlet, and a second connecting tube formed substantially perpendicularly to the first connecting tube;
a plurality of connecting pipes, connected between any two adjacent water cooling heads, and each of the plurality of connecting pipes comprising one end connected substantially in parallel with a bottom surface of the housing to the second connecting tube of the connector installed in the water inlet of one of the two adjacent water cooling heads and another end connected substantially in parallel with the bottom surface of the housing to the second connecting tube of the connector installed in the water outlet of another one of the two adjacent water cooling heads to connect the water cooling heads in line with a series connection;
a water-inlet pipe, having one end connected substantially in parallel with the bottom surface of the housing to the second connecting tube of the connector installed in the water inlet of one of the water cooling head located outermost in the water cooling heads, and another end connected substantially in parallel with the bottom surface of the housing to a water-inlet pump; and
a water-outlet pipe, having one end connected substantially in parallel with the bottom surface of the housing to the second connecting tube of the connector installed in the water outlet of another one of the water cooling heads located outermost in the water cooling heads, and another end connected substantially in parallel with the bottom surface of the housing to a water-inlet pump;
wherein the housing comprises a lower seat and an upper seat, and the lower seat comprises a lower chamber;
a plurality of water cooling fins are disposed in the lower chamber; and
the upper seat comprises the water inlet and the water outlet, and the upper seat is combined with the lower seat to cover the lower chamber;
wherein the water inlet and the water outlet are located in the upper seat and above a middle of the plurality of water cooling fins to facilitate working fluid inside the water cooling head flowing uniformly, and a gap is formed between a top side of the plurality of water cooling fins and the water inlet and the water outlet.

2. The water cooling structure according to claim 1, wherein one side of each water cooling head is attached to a heat source, and the water inlet and the water outlet are disposed on another side of each water cooling head.

3. The water cooling structure according to claim 1, further comprising a sealing gasket sandwiched between the lower seat and the upper seat.

4. The water cooling structure according to claim 1, wherein the water inlet and the water outlet are located on a middle location of the upper seat.

5. The water cooling structure according to claim 1, wherein each of the plurality of water cooling head comprises a plurality of heat dissipation fins, and the heat dissipation fins are arranged on two sides of the upper seat.

6. The water cooling structure according to claim 5, wherein the water inlet and the water outlet are arranged parallelly between the heat dissipation fins disposed on the two sides of the upper seat.

* * * * *